United States Patent [19]
McAnally et al.

[11] Patent Number: 5,949,652
[45] Date of Patent: Sep. 7, 1999

[54] COMPUTER POWER SUPPLY INSERTION AND EXTRACTION APPARATUS AND METHOD

[75] Inventors: Andrew L. McAnally, Georgetown; R. Steven Mills; Eric Holloway, both of Austin, all of Tex.

[73] Assignee: Dell U.S.A., L.P., Round Rock, Tex.

[21] Appl. No.: 08/957,433

[22] Filed: Oct. 24, 1997

[51] Int. Cl.⁶ .......................... H01H 3/20; H01R 13/639; H05K 7/16

[52] U.S. Cl. .......................... 361/726; 361/725; 361/727; 439/911

[58] Field of Search .................................. 361/683, 686, 361/724, 725, 726, 727; 312/223.2; 364/708.1; 174/54, 59, 60; 439/299, 300, 483, 911

[56] References Cited

U.S. PATENT DOCUMENTS

| | | | |
|---|---|---|---|
| 2,514,246 | 7/1950 | Knox | 361/727 |
| 3,675,084 | 7/1972 | Jammaud | 361/724 |
| 4,387,956 | 6/1983 | Cline | 439/299 |
| 4,680,425 | 7/1987 | Speraw | 174/724 |
| 4,716,495 | 12/1987 | Craker | 439/911 |
| 4,885,436 | 12/1989 | Pham et al. | |
| 5,299,098 | 3/1994 | Schussler et al. | 361/725 |
| 5,586,003 | 12/1996 | Schmitt et al. | 361/683 |
| 5,612,854 | 3/1997 | Wiscombe et al. | |
| 5,656,869 | 8/1997 | Gluskoter et al. | |
| 5,761,045 | 6/1998 | Olson et al. | 361/726 |

*Primary Examiner*—Lynn D. Feild
*Assistant Examiner*—John D. Reed
*Attorney, Agent, or Firm*—Haynes and Boone, L.L.P.

[57] ABSTRACT

A device for securing a power supply in a computer chassis includes a power supply housing having a handle movably mounted thereon. An insertion and extraction cam device extends from the handle and is pivotable into and out of engagement with a cam receiver in the chassis. A housing locking device extends from the handle and is slidable into and out of engagement with a lock receiver in the chassis. A power switch actuator tab is connected to extend from the handle and slide into and out of engagement with a power switch actuator arm mounted in the power supply. A power cord lock is connected to extend from the handle and slide to and from a lock position adjacent a power cord plug attached to the power supply.

10 Claims, 8 Drawing Sheets

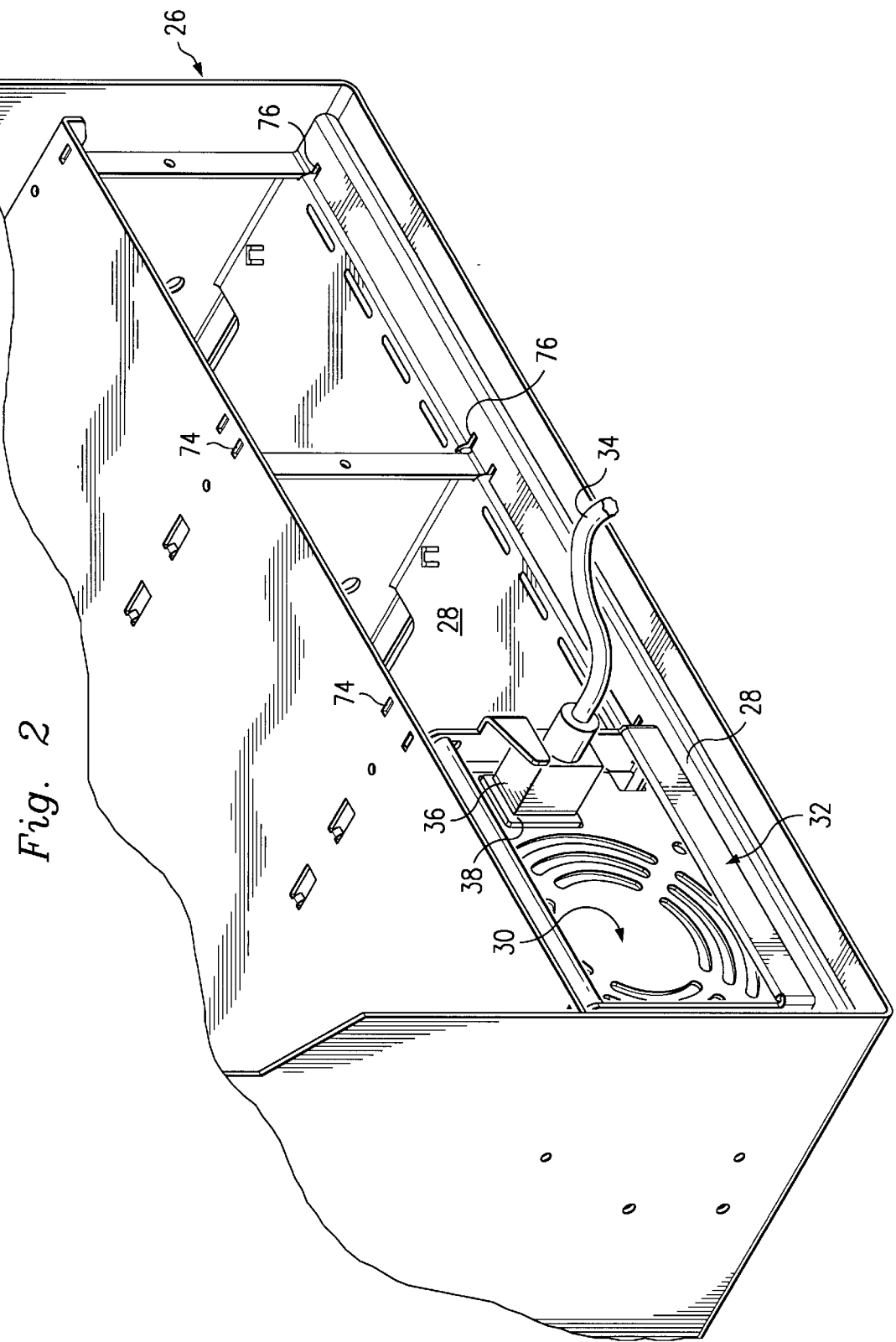

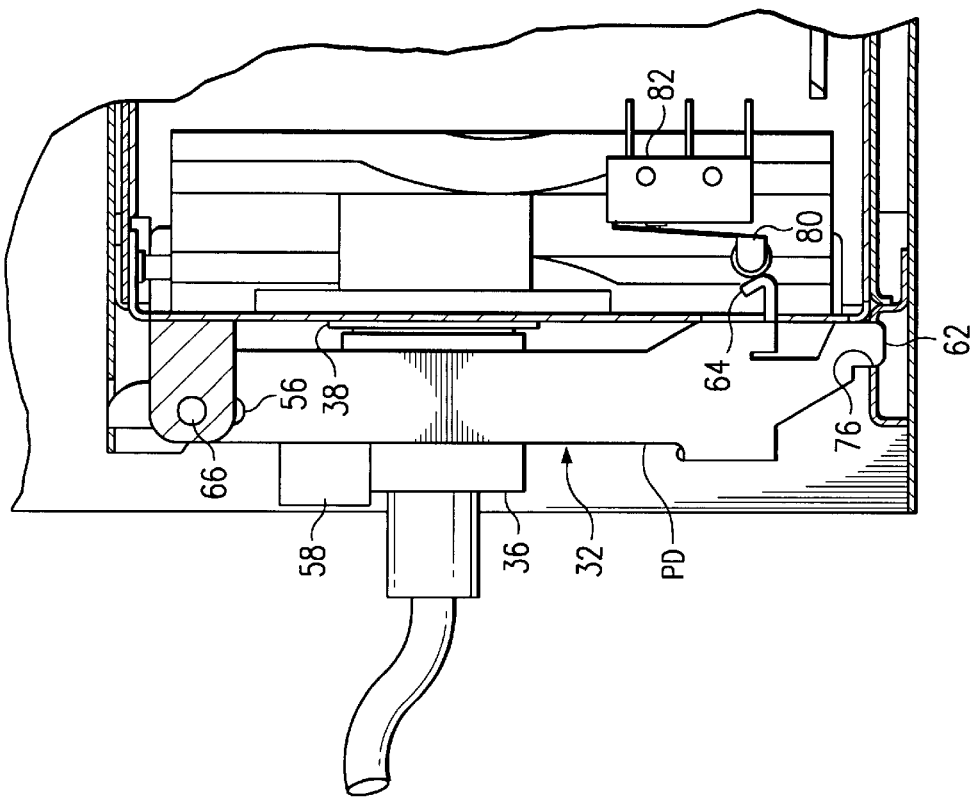
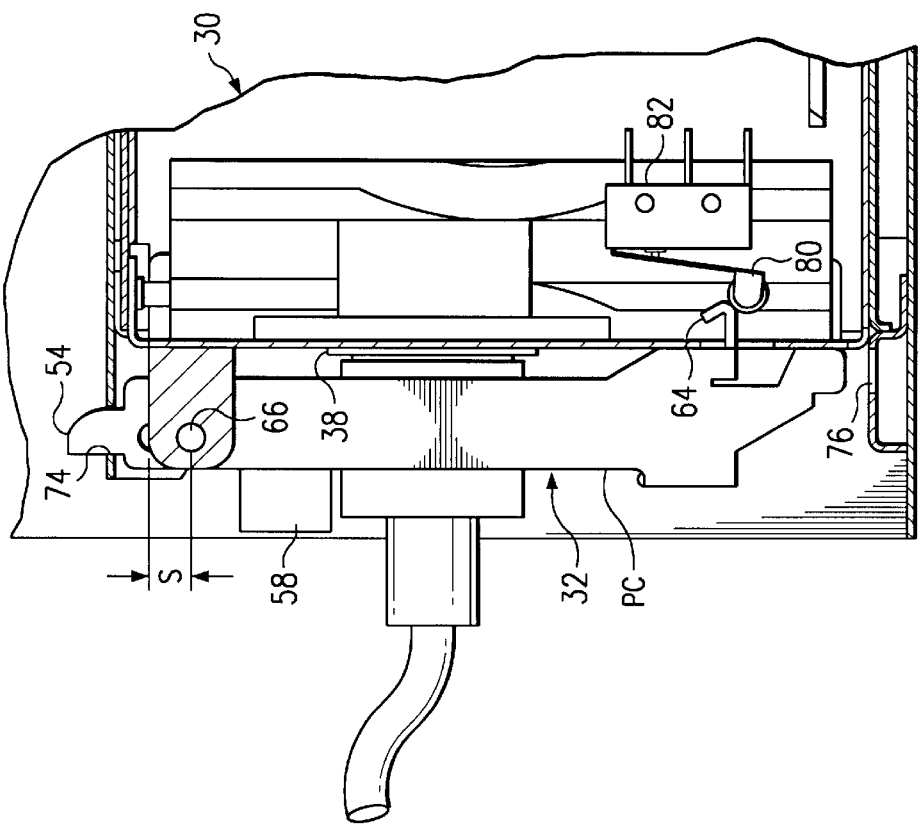

COMPUTER POWER SUPPLY INSERTION AND EXTRACTION APPARATUS AND METHOD

BACKGROUND

The disclosures herein relate generally to computer system power supplies and more particularly to a method and apparatus for inserting the power supply into a computer chassis and extracting the power supply from the chassis.

There are several areas of concern with regard to the insertion and extraction of power supplies in computer chassis. One area concerns the insertion and extraction force. In a computer chassis with a power supply that is "blind mated", i.e. inserted into a multi-contact connector receptacle which is not in sight during insertion, there may be a considerable force required to install and extract the power supply. Because it is undesirable to impose shock loads on other components in the chassis, slamming the power supply in place or yanking the power supply from the chassis are undesirable alternatives.

One attempt to overcome this problem is to use a screw mechanism to avoid sudden insertion and retraction forces on the connectors to seat or unseat the power supply such as that described in U.S. Pat. No. 5,612,854. However, the screw mechanism comprises several parts and is expensive. Another extraction device is disclosed in U.S. Pat. No. 4,885,436.

Another area of concern is "hot plugging" which involves the insertion or extraction of one of the power supplies in a redundant system when the system is "live." It is desirable for the particular power supply to be turned off at the time it is being inserted or extracted. This is to reduce the potential for sparking at the connector contacts. The redundant system, which includes multiple power supplies, is designed to compensate during the hot plugging operation of one of the power supplies. Thus, the problem of keeping the particular power supply off during the hot plugging operation has been addressed by providing a manual on/off switch on each power supply. In this manner, a particular power supply which is being inserted or extracted can be manually turned off during replacement while the system remains live.

Still another area of concern is that an AC power cable, which plugs directly into each power supply, can be accidentally removed if bumped, caught or entangled in some way. This would result in an undesirable shutting down of a power supply. To address this problem, cable retention devices have been provided to protect from unintentional removal of the AC plugs.

Each of the above-mentioned solutions carry a common theme which is that a separate part or solution has been provided for each problem. Therefore, what is needed is a single device which has features addressing each of the above-mentioned areas of concern, i.e. which can reduce the extraction and insertion force without the use of tools, which can actuate the power supply on/off switch, and which incorporates a cable retention device.

SUMMARY

One embodiment, accordingly, provides a movable handle attached to a power supply which assists in power supply insertion and extraction, which actuates a power supply on/off switch, and which provides AC plug protection. To this end, a power supply mounting device includes a power supply housing having a handle connected thereto. The handle is connected to move in a first motion relative to the housing to move an insertion and extraction cam device extending from the handle. The handle is also connected to move in a second motion relative to the housing to move an actuator extending from the handle to actuate a power supply switch, and to move an arm extending from the handle, to a plug protecting position.

A principal advantage of this embodiment is that the handle provides an insertion and extraction force for seating and unseating the power supply connector with the chassis without the need for slamming or yanking the power supply. Also, the handle provides strain relief protection for an AC power plug attached to the power supply and also actuates a power supply on/off switch.

BRIEF DESCRIPTION OF THE DRAWINGS

FIG. 2 is an isometric view partially illustrating an embodiment of a computer chassis.

FIG. 7 is a side view illustrating an embodiment of the handle in a closed and unlatched position.

FIG. 8 is a side view illustrating an embodiment of the handle in a closed and latched position.

DETAILED DESCRIPTION OF THE PREFERRED EMBODIMENT

Figure 1:
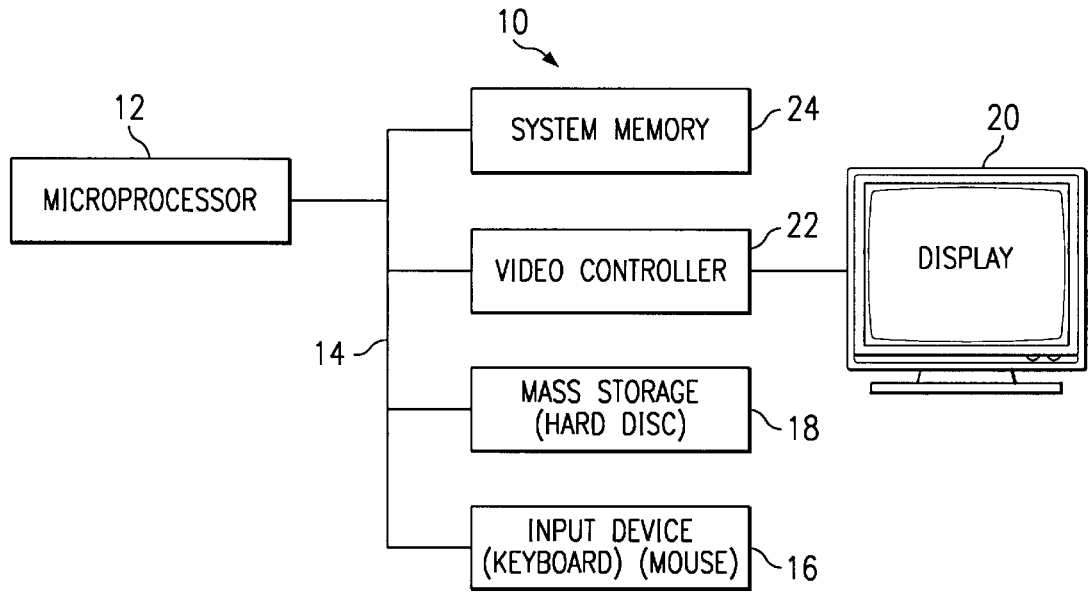
FIG. 1 is a diagrammatic view illustrating an embodiment of a computer system.

In one embodiment, computer system 10, FIG. 1, includes a microprocessor 12, which is connected to a bus 14. Bus 14 services as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and pads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

In FIG. 2, a computer chassis 26 includes certain components of system 10 and a plurality of power supply bays 28. A power supply housing 30 containing a power supply is removably mounted in one of the bays 28. A handle 32 is connected to the power supply housing 30 and an AC power cord 34 terminates at an AC plug 36 which is electrically connected to a receptacle 38 provided in housing 30. A pair of cam receivers 74, and latch receivers 76, are formed in each bay 28 of chassis 26.

Figure 3:
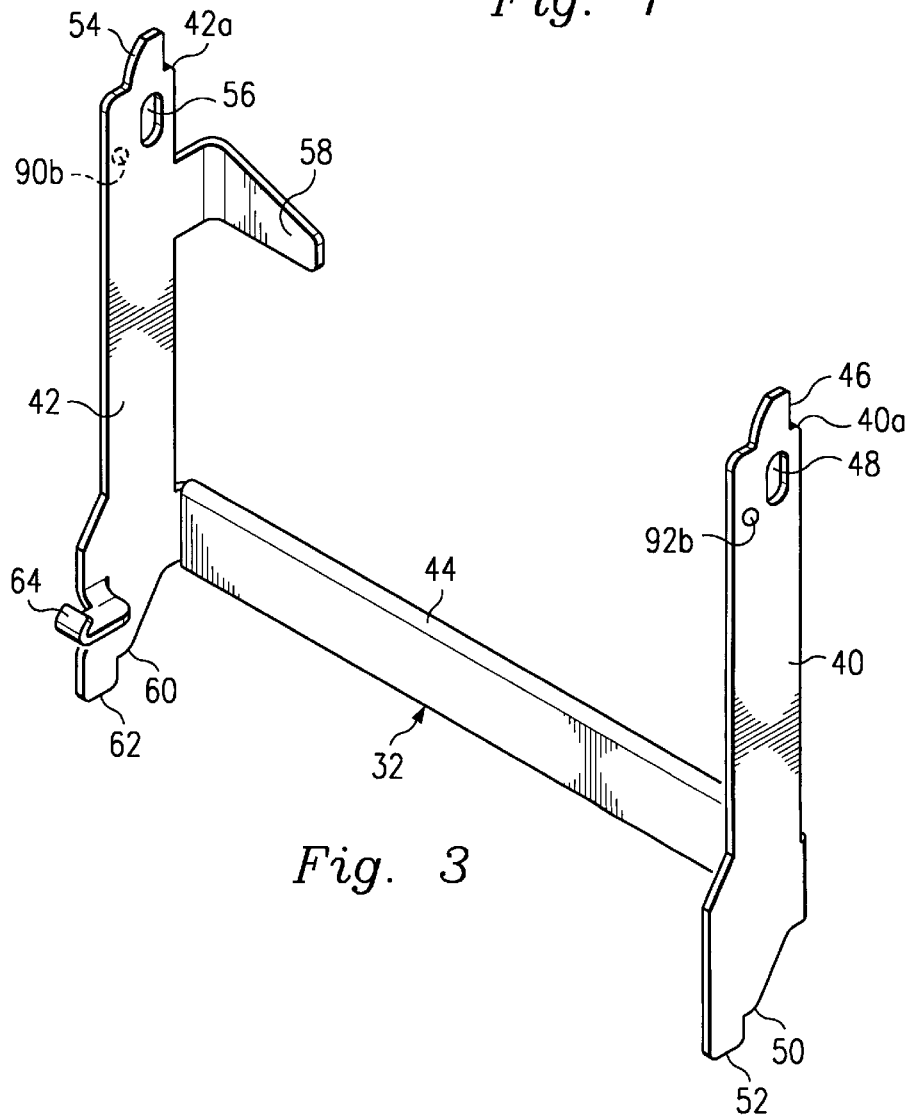
FIG. 3 is an isometric view illustrating an embodiment of a power supply handle.

FIG. 3 illustrates handle 32 which includes a first member 40 and a second member 42 interconnected by a hand grip cross-member 44. First member 40 includes a first end 40a having an insert and extract cam 46 extending therefrom. An elongated slot 48 is formed in member 40 adjacent first end 40a. A second end 50 of member 40 includes a housing locking device in the form of a latch 52 extending therefrom. Second member 42 includes a first end 42a having an insert and extract cam 54 extending therefrom. An elongated slot 56 is formed in member 42 adjacent first end 42a. A power plug lock arm 58 is connected to extend from second member 42 adjacent first end 42a. A second end 60 of member 42 includes a housing locking device in the form of a latch 62 extending therefrom. Also, a power switch actuator tab 64 is connected to extend from member 42 adjacent second end 60.

Figure 4:
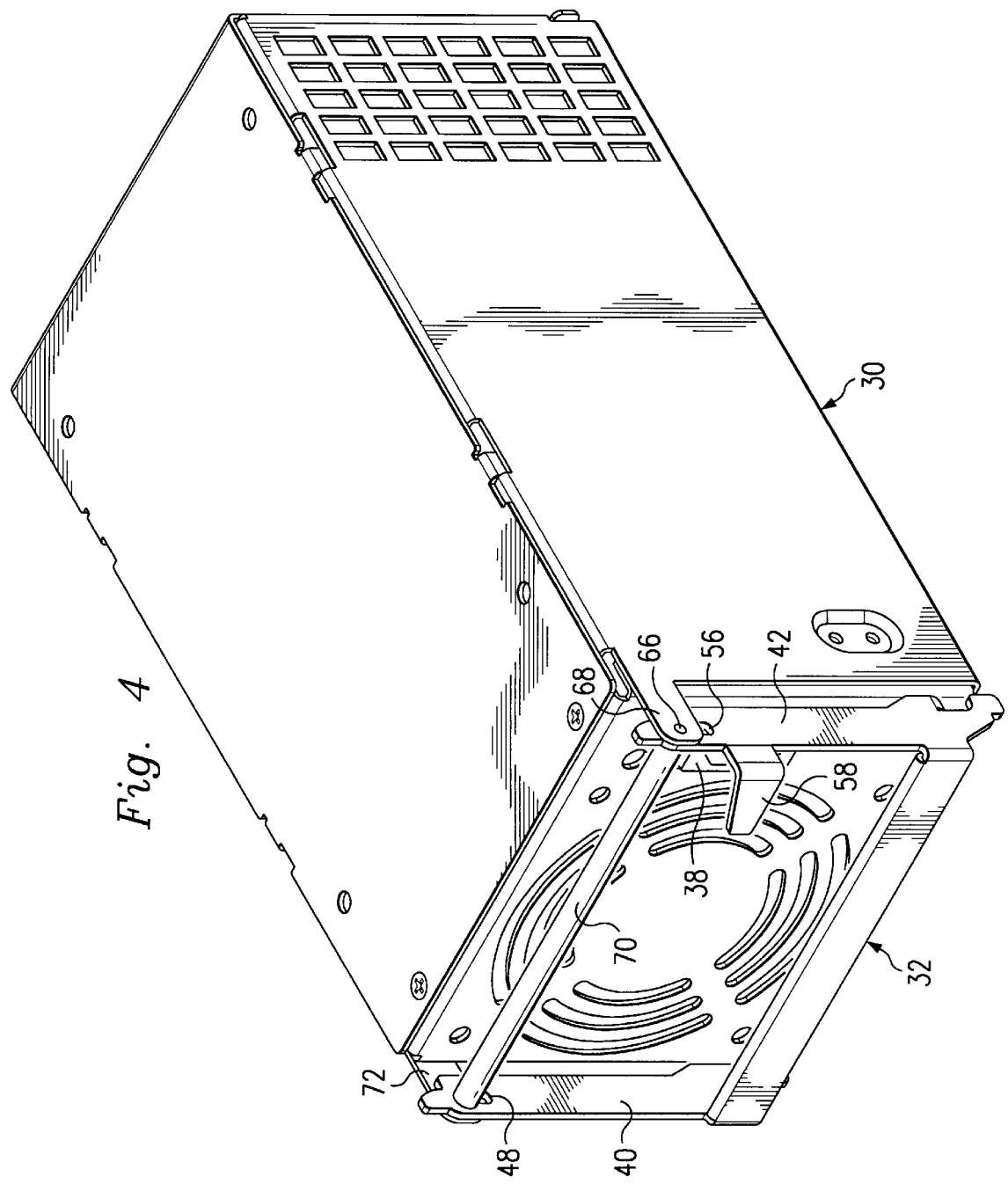
FIG. 4 is an isometric view illustrating an embodiment of a power supply housing including the handle.

Handle 32, FIG. 4, is suitably connected to housing 30 at a cylindrical pivot pin 66 which is secured to a first mounting tab 68. Pin 66 extends through elongated slot 56 of member 42 and between members 42 and 40. Pin 66 also extends through elongated slot 48 of member 40 and is secured to a second mounting tab 72. Power cord lock arm 58 extends from member 42 and is positioned adjacent receptacle 38, as will be discussed below in greater detail.

Figure 5:
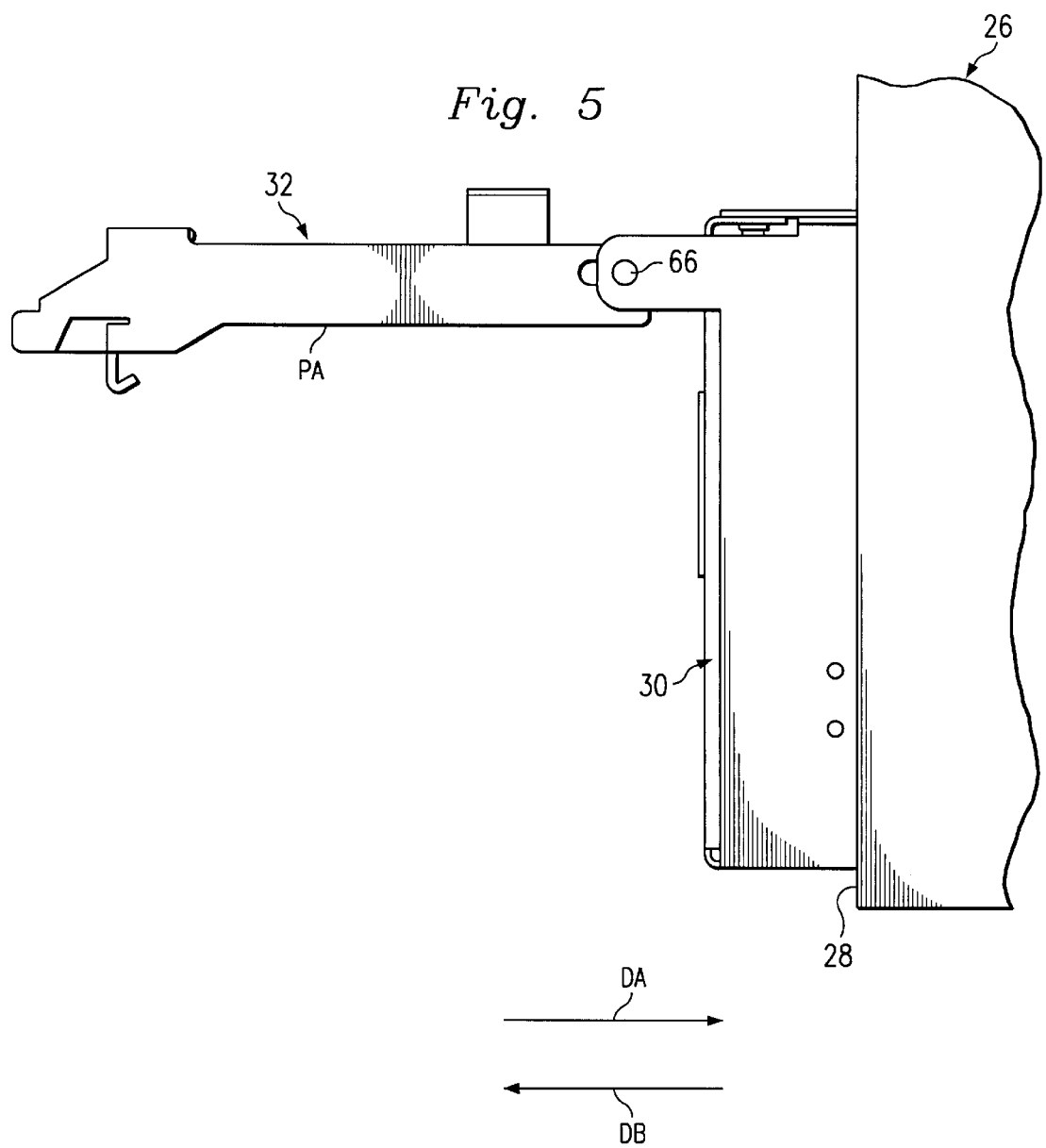
FIG. 5 is a side view illustrating an embodiment of the handle in a raised position on a power supply housing mounted in a computer chassis.
Figure 6:
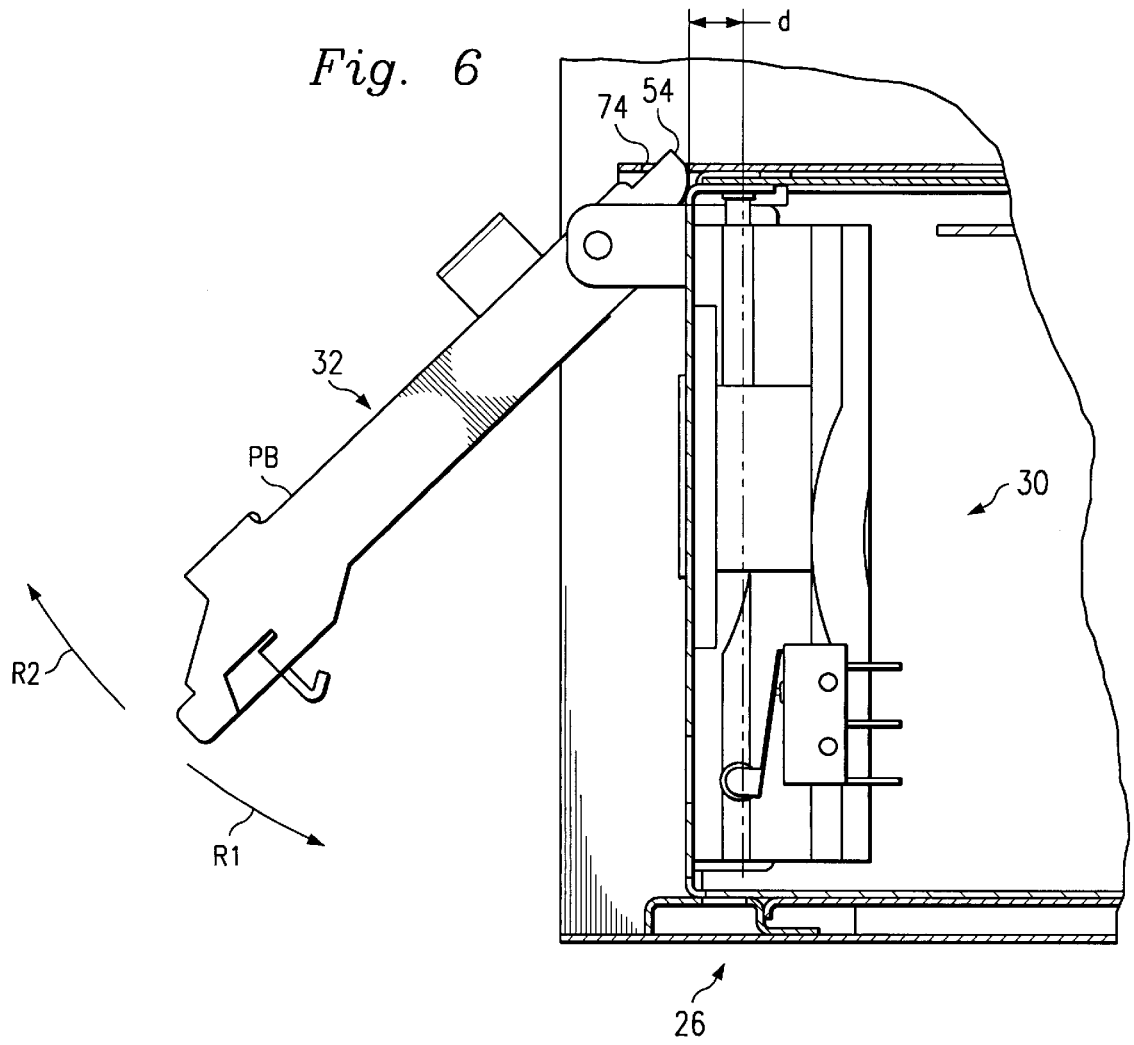
FIG. 6 is a side view illustrating an embodiment of the handle in an intermediate position.

In FIG. 5, handle 32 is connected to housing 30 in such a manner as to permit handle 32 to move in a first pivotal motion relative to housing 30 and to move in a second sliding motion relative to housing 30 as will now be described. Handle 32 is illustrated in a first position PA, FIG. 5, and is rotatable about pin 66 in reciprocal directions designated R1, R2, through intermediate position PB, FIG. 6, and is further rotatable about pin 66 to a second position PC, FIG. 7. Handle 32 is also slidable from second position PC through a distance designated s, to a locked position PD, FIG. 8, by movement of elongated slots 48, 56, along cylindrical pin 66, see also FIG. 4.

Housing 30, FIG. 5, is inserted into bay 28 of chassis 26 and slid into chassis 26 in a direction indicated by a directional arrow designated DA, to position a housing plug (not shown) on housing 30 to engage a chassis receptacle (not shown) in chassis 26 in the well known manner. Referring again to FIG. 6, as handle 32 rotates to intermediate position PB, cams 46 and 54 (only one of which is visible in FIG. 6) engage cam receivers 74. Further rotation of handle 32 urges housing 30 through a distance d, FIG. 6, and into a seated position in chassis 26 with handle 32 in second position PC, FIG. 7, enabling full engagement of the above mentioned housing plug and chassis receptacle (not shown). Rotation of handle 32 to second position PC, also positions power plug lock arm 58 adjacent receptacle 38 and positions power switch actuator tab 64 adjacent a power switch actuator arm 80, which extends from an on-off micro-switch 82, shown in the "off" position and mounted in power supply housing 30.

Figure 9:
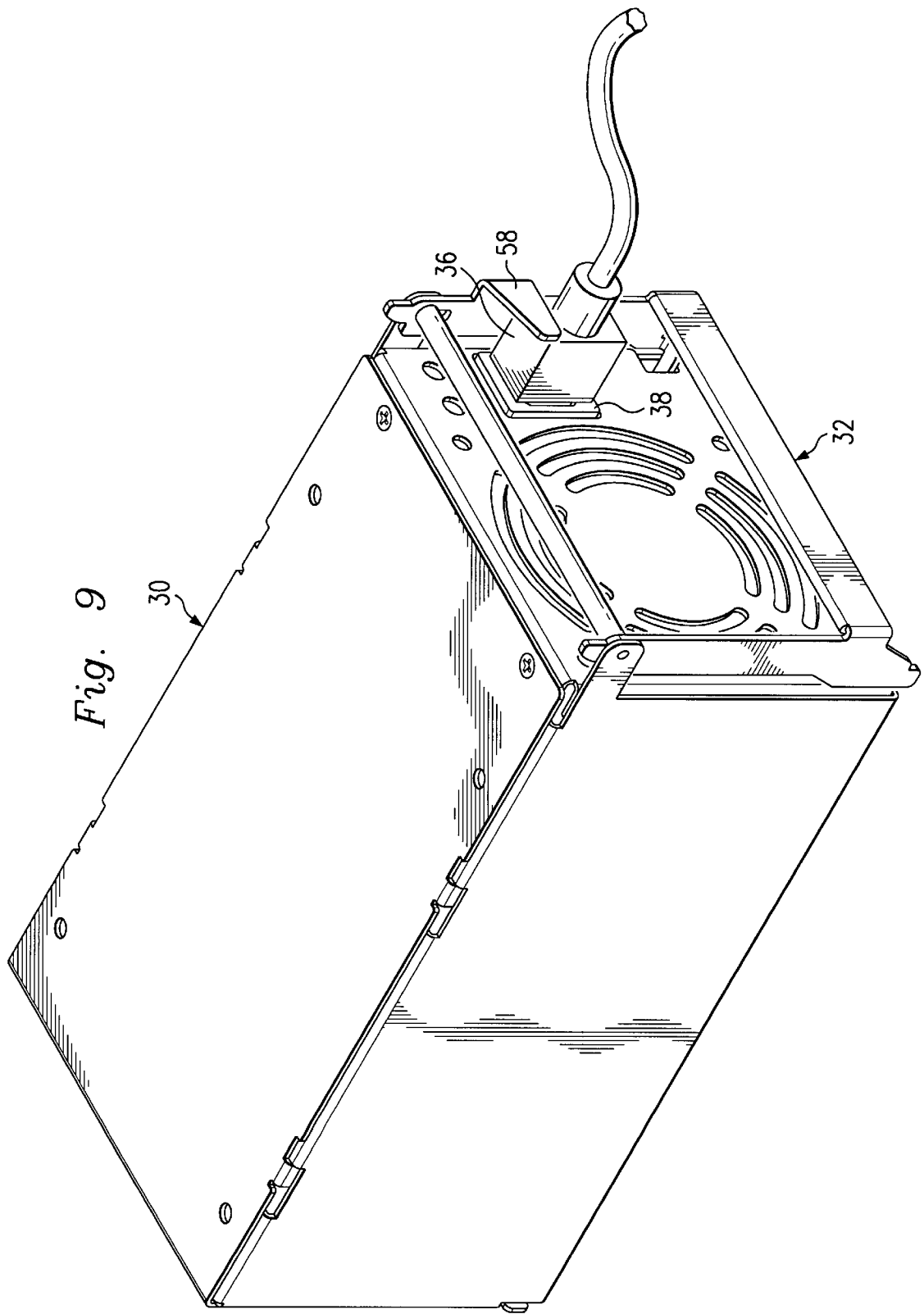
FIG. 9 is an isometric view illustrating an embodiment of the power supply housing including a handle in the closed and latched position.

Sliding movement of handle 32 through distance s, from second position PC, to locked position PD, FIG. 8, accomplishes insertion of latches 52, 62, (only one of which is visible in FIG. 8) in their respective latch receivers 76, accomplishes positioning power plug lock arm 58 in position to interfere with removal of power plug 36 from receptacle 38, see also FIG. 9, and accomplishes engagement of actuator tab 64 with actuator arm 80 of micro-switch 82, FIG. 8 actuating switch 82 to the "on" position.

Figure 10:
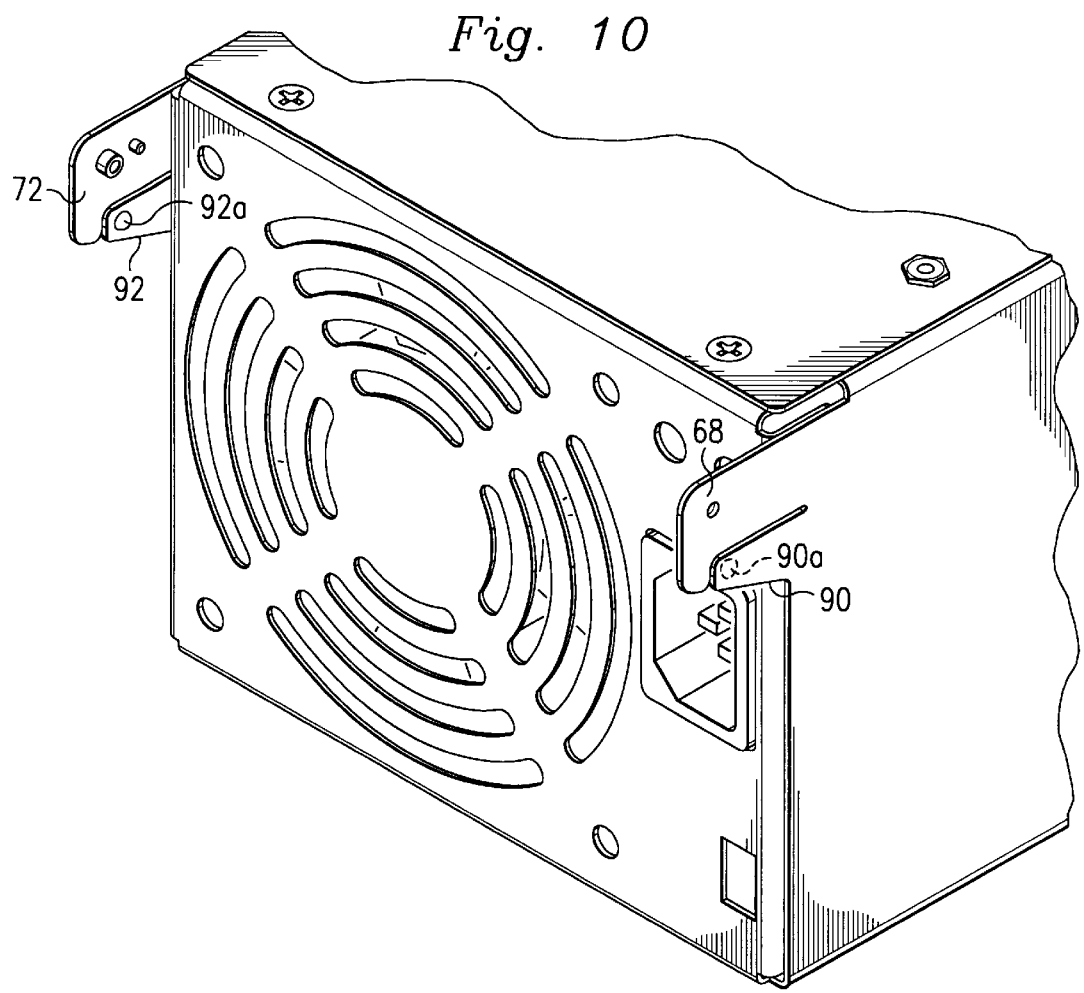
FIG. 10 is an isometric view partially illustrating an alternative embodiment of a power supply housing including detent tabs.

As an alternative, mounting tabs 68, 72, FIG. 10, may include optional detent tabs 90, 92 respectively. Each detent tab 90, 92 includes a pair of respective protruding detents 90a, 92a provided for engagement with a pair of corresponding recessed detents 90b, 92b, formed in members 40, 42, respectively, of handle 32, FIG. 3. Detents 90a, 92a and corresponding detents 90b, 92b, respectively, form a snap-in secondary means of retaining handle 32 in position PD, FIG. 8, discussed above.

In operation, when it is desired to remove power supply 30 from chassis 26, cross member 44 is hand-gripped and handle 32 is slidably moved from position PD, FIG. 8, to position PC, FIG. 7. This movement of handle 32 moves actuator tab 64 to permit movement of actuator arm 80 to the "off" position thus turning the power supply off. The movement described also disengages handle 32 from latch receivers 76. Subsequent pivotal movement of handle 32 from position PC, FIG. 7, to position PA, FIG. 5, disengages handle 32 from cam receivers 74 moving housing 30 over distance d, FIG. 6, and disengages the housing plug (not shown) from the chassis receptacle (not shown). Housing 30 may be easily removed from bay 28 of chassis 26 in the direction designated DB, FIG. 5, by exerting a pulling force on cross member 44.

For insertion, with handle 32 in position PA, housing 30 is inserted in bay 28 of chassis 26 in the direction designated DA. Handle 32 is pivoted to position PC, FIG. 7, which engages handle 32 into cam receivers 74 moving housing 30 over distance d, FIG. 6, and urging the housing plug into the chassis receptacle (not shown). Handle 32 is slidably moved to position PD, FIG. 8, which moves actuator tab 64 to urge actuator arm 80 to the "on" position, and simultaneously, handle 32 engages latch receivers 76 thus securing housing 30 in chassis 26, and lock arm 58 is positioned to retain power plug 36 in receptacle 38.

As it can be seen, the principal advantages of these embodiments are that a single device in the form of a handle is attached to the power supply housing in a manner permitting the handle to pivot and slide relative to the housing. The pivoting movement of the handle activates a cam to supply an insertion and extraction force to a connector which electrically connects and disconnects the power supply and the computer chassis. The sliding movement of the handle latches and unlatches a lock device to secure the power supply in the chassis, moves an actuator tab to turn a power switch on and off, and positions a plug protection device to secure an AC plug from inadvertently being unplugged from the power supply.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A power supply mounting device comprising:
   a power supply housing;
   a handle connected to the housing;
   the handle being connected to move in a pivotal motion relative to the housing to move an insertion and extraction cam device extending adjacent a first end of the handle; and the handle being connected to move in a sliding motion relative to the housing to move an actuator extending adjacent a second end of the handle opposite the first end to actuate a power supply switch, and to move a lock arm extending adjacent the second end of the handle to a plug protecting position.

2. The mounting device as defined in claim 1 further comprising a locking device extending adjacent the second end of the handle to secure the housing in a stored position.

3. The mounting device as defined in claim 2 wherein the cam device extends in a first direction and the locking device extends in a second direction opposite the first direction.

4. A device for securing a power supply in a computer chassis comprising:

a computer chassis;

a power supply housing mounted in the chassis;

a handle movably connected to pivot and slide relative to the housing;

an insertion and extraction cam device extending adjacent a first end of the handle and pivotable into and out of engagement with a cam receiver in the chassis;

a housing locking device extending adjacent a second end of the handle opposite the first end and slidable into and out of engagement with a lock receiver in the chassis;

a power cord lock connected to extend adjacent the second end of the handle; and a power switch actuator tab connected to extend adjacent the second end of the handle.

5. The securing device as defined in claim 4 where the cam device extends in a first direction and the housing locking device extends in a second direction opposite the first direction.

6. A computer system comprising:

a microprocessor;

an input device coupled to provide input to the microprocessor;

a mass storage device coupled to the microprocessor;

a display coupled to the microprocessor by a video controller;

a memory coupled to provide storage to facilitate execution of computer programs by the microprocessor;

a chassis;

a power supply housing removably mounted in the chassis;

a handle pivotably and slidably connected to the housing;

an insertion and extraction cam device extending adjacent a first end of the handle and pivotable into and out of engagement with a cam receiver in the chassis;

a housing locking device extending adjacent a second end of the handle opposite the first end and slidable into and out of engagement with a lock receiver in the chassis;

a power cord lock connected to extend adjacent the second end of the handle; and a power switch actuator tab connected to extend adjacent the second end of the handle.

7. The computer system as defined in claim 6 wherein the cam device extends in a first direction and the housing locking device extends in a second direction opposite the first direction.

8. A device for securing a power supply in a computer chassis comprising:

a computer chassis;

a power supply housing mounted in the chassis;

a handle pivotably connected for urging the housing into and out of engagement with the chassis;

a power cord having a plug attached to the power supply housing adjacent the handle;

an insertion and extraction cam device extending adjacent a first end of the handle and pivotable into and out of engagement with a cam receiver in the chassis;

a housing locking device extending adjacent a second end of the handle opposite the first end and slidable into and out of engagement with a lock receiver in the chassis;

a power cord lock connected to extend adjacent the second end of the handle and slidable adjacent the power cord plug; and a power switch actuator tab connected to extend adjacent the second end of the handle to slide into and out of engagement with a power switch actuator arm mounted in the power supply housing.

9. The securing device as defined in claim 8 wherein the cam device extends in a first direction and the housing locking device extends in a second direction opposite the first direction.

10. A method of securing a power supply in a computer chassis comprising the steps of:

attaching a handle to the power supply for sliding and pivoting movement relative thereto;

inserting the power supply into the chassis with the handle in a first position so that a connector on the power supply engages a receptacle on the chassis;

pivoting the handle toward the power supply so that a first portion of the handle engages a first portion the chassis and urges the connector into the receptacle;

sliding the handle adjacent the power supply so that a second portion of the handle engages a second portion of the chassis and locks the power supply in a secured position in the chassis;

sliding the handle to position a power cord lock, connected adjacent the second portion of the handle, adjacent a power cord plug engaged with the power supply; and sliding the handle for engaging a power switch actuator, connected adjacent the second portion of the handle, with a power switch actuator arm mounted in the power supply.

* * * * *